US007295141B1

(12) United States Patent
Wu et al.

(10) Patent No.: US 7,295,141 B1
(45) Date of Patent: Nov. 13, 2007

(54) METHOD FOR MIXING SIGNALS WITH AN ANALOG-TO-DIGITAL CONVERTER

(75) Inventors: Li-Te Wu, Taipei (TW); Wei-Chan Hsu, Cupertino, CA (US)

(73) Assignee: Fortemedia, Inc., Cupertino, CA (US)

( * ) Notice: Subject to any disclaimer, the term of this patent is extended or adjusted under 35 U.S.C. 154(b) by 0 days.

(21) Appl. No.: 11/457,831

(22) Filed: Jul. 17, 2006

(51) Int. Cl.
*H03M 1/66* (2006.01)

(52) U.S. Cl. ........................................ 341/143; 341/144

(58) Field of Classification Search ................ 341/144, 341/155, 143; 381/111, 119
See application file for complete search history.

(56) References Cited

U.S. PATENT DOCUMENTS

| | | | | |
|---|---|---|---|---|
| 5,835,044 | A * | 11/1998 | Nishino | 341/143 |
| 5,872,755 | A * | 2/1999 | Inazawa et al. | 369/59.26 |
| 6,160,953 | A * | 12/2000 | Fuchigami et al. | 386/105 |
| 6,173,061 | B1 * | 1/2001 | Norris et al. | 381/309 |
| 6,326,912 | B1 * | 12/2001 | Fujimori | 341/143 |
| 6,958,717 | B1 * | 10/2005 | Minogue | 341/102 |
| 7,190,293 | B2 * | 3/2007 | Clement et al. | 341/143 |
| 2005/0135630 | A1 * | 6/2005 | Zoso et al. | 381/23 |

OTHER PUBLICATIONS

Pending U.S. Appl. No. 11/457,836, filed Jul. 17, 2006.

* cited by examiner

*Primary Examiner*—Peguy JeanPierre
(74) *Attorney, Agent, or Firm*—Thomas, Kayden, Horstemeyer & Risley

(57) ABSTRACT

The invention provides a method for mixing signals with an analog-to-digital converter. The analog-to-digital converter receives a plurality of analog signals. First, the plurality of analog signals are respectively converted to a plurality of first datastreams with a plurality of first delta-sigma modulators. The plurality of first datastreams are then mixed to generate at least one second datastream. The at least one second datastream is then converted to at least one third datastream with at least one second delta-sigma modulator. The at least one second delta-sigma modulator and the plurality of first delta-sigma modulators are triggered by the same clock signal.

22 Claims, 6 Drawing Sheets

METHOD FOR MIXING SIGNALS WITH AN ANALOG-TO-DIGITAL CONVERTER

CROSS REFERENCE TO RELATED APPLICATIONS

This application is related to copending application entitled "Method for converting an analog signal to a one-bit datastream and analog-to-digital converter for same",U.S. application Ser. No. 11/457,836, filed Jul. 17, 2006, and now abandoned.

BACKGROUND OF THE INVENTION

1. Field of the Invention

The invention relates to signal processing, and more particularly to an array microphone.

2. Description of the Related Art

The Delta-Sigma (ΔΣ) modulation is a kind of analog-to-digital signal conversion derived from delta modulation. An analog to digital converter (ADC) circuit which implements this technique can be easily realized using low-cost CMOS processes. The benefit of a delta-sigma converter is that it moves most of the cinversion process into the digital domain. This makes it easier to combine high-performance analog with digital processing.

FIG. 1 shows an example of analog-to-digital converter 120 for converting an analog signal to a digital one-bit datastram. The analog-to-digital converter 120 includes a multi-bit delta-sigma modulator 104 and a one-bit delta-sigma modulator 106. A sound wave in the air is received by a microphone module 102 and converted to an analog signal. For further processing, the analog-to-digital converter 120 then converts the analog signal to a digital one-bit datastream. The multi-bit delta-sigma modulator 104 first converts the analog signal to a multi-bit datastream, which is not as sensitive to clock jitters as the one-bit datastream. The one-bit delta-sigma modulator 106 then converts the multi-bit datastream to the one-bit datastream.

Both the multi-bit delta-sigma modulator 104 and the one-bit delta-sigma modulator 106 are triggered by the same clock signal. Because the one-bit delta-sigma modulator 106 is a pure digital modulator, the jitters of the clock signal make no impact on the one-bit datastream generated by the one-bit delta-sigma modulator 106. Thus, although triggered by a clock signal, the analog-to-digital converter 120 can better avoid clock jitter interference than a single one-bit delta-sigma modulator which directly converts the analog signal to a one-bit datastream.

With the increased maturity in speech and speaker processing technologies, and the prevalence of telecommunications, there is a need for effective speech acquisition devices. Microphone arrays have a distinct advantage as they enable hands-free acquisition of speech with little constraint on the user, and they can also provide information on the location of speakers. A microphone array consists of multiple microphones at different locations. Using sound propagation principles, the individual microphone signals can be filtered and combined to enhance sound originating from a particular direction or location. The location of the principal sound sources can also be determined dynamically by investigating the correlation between different microphone channels.

FIG. 2 is a block diagram of a portion of a signal processing device 200, which includes a microphone array 210 for acquiring sound waves. The microphone array 210 includes two microphone modules 202 and 212, which are oriented towards different directions of the signal processing device 200. The microphone modules 202 converts a left sound wave $S_L$ to an analog signal $A_L$, and the microphone modules 212 converts a right sound wave $S_R$ to an analog signal $A_R$. The analog-to-digital converters 208 and 218 then respectively convert the analog signals $A_L$ and $A_R$ to digital one-bit datastreams $D_L$ and $D_R$. Both of the analog-to-digital converters 208 and 218 have the same composition as the analog-to-digital converter 120 of FIG. 1, and respectively includes a multi-bit delta-sigma modulator and a one-bit delta-sigma modulator connected in cascade. The one-bit delta-sigma modulators 204 and 214 converts analog signals $A_L$ and $A_R$ to multi-bit datastreams $M_L$ and $M_R$. The one-bit delta-sigma modulators 206 and 208 then convert the multi-bit datastreams $M_L$ and $M_R$ to one-bit datastreams $D_L$ and $D_R$.

The signal processing device 200, however, lacks the ability to mix signals. Because the analog-to-digital converters 208 and 208 respectively includes a multi-bit delta-sigma modulator and a one-bit delta-sigma modulator, the multi-bit datastreams output by the multi-bit delta-sigma modulators can be further processed by a mixer to generate the input datastreams of the one-bit delta-sigma modulators. Thus, the number of the one-bit delta-sigma modulators can be reduced, and an analog-to-digital converter capable of mixing signals is introduced.

BRIEF SUMMARY OF THE INVENTION

The invention provides a method for mixing signals with an analog-to-digital converter. The analog-to-digital converter receives a plurality of analog signals. First, the plurality of analog signals are respectively converted to a plurality of first datastreams with a plurality of first delta-sigma modulators. The plurality of first datastreams are then mixed to generate at least one second datastream. The at least one second datastream is then converted to at least one third datastream with at least one second delta-sigma modulator. Both the at least one second delta-sigma modulator and the plurality of first delta-sigma modulators are triggered with the same clock signal.

The invention also provides an analog-to-digital converter capable of mixing signals. The analog-to-digital converter receives a plurality of analog signals and comprises a plurality of first delta-sigma modulators, a mixer coupled to the plurality of first delta-sigma modulators, and at least one second delta-sigma modulator coupled to the mixer. The plurality of first delta-sigma modulators convert the plurality of analog signals to a plurality of first datastreams. The mixer then mixes the plurality of first datastreams to generate at least one second datastream. The at least one second delta-sigma modulator then converts the at least one second datastream to at least one third datastream.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
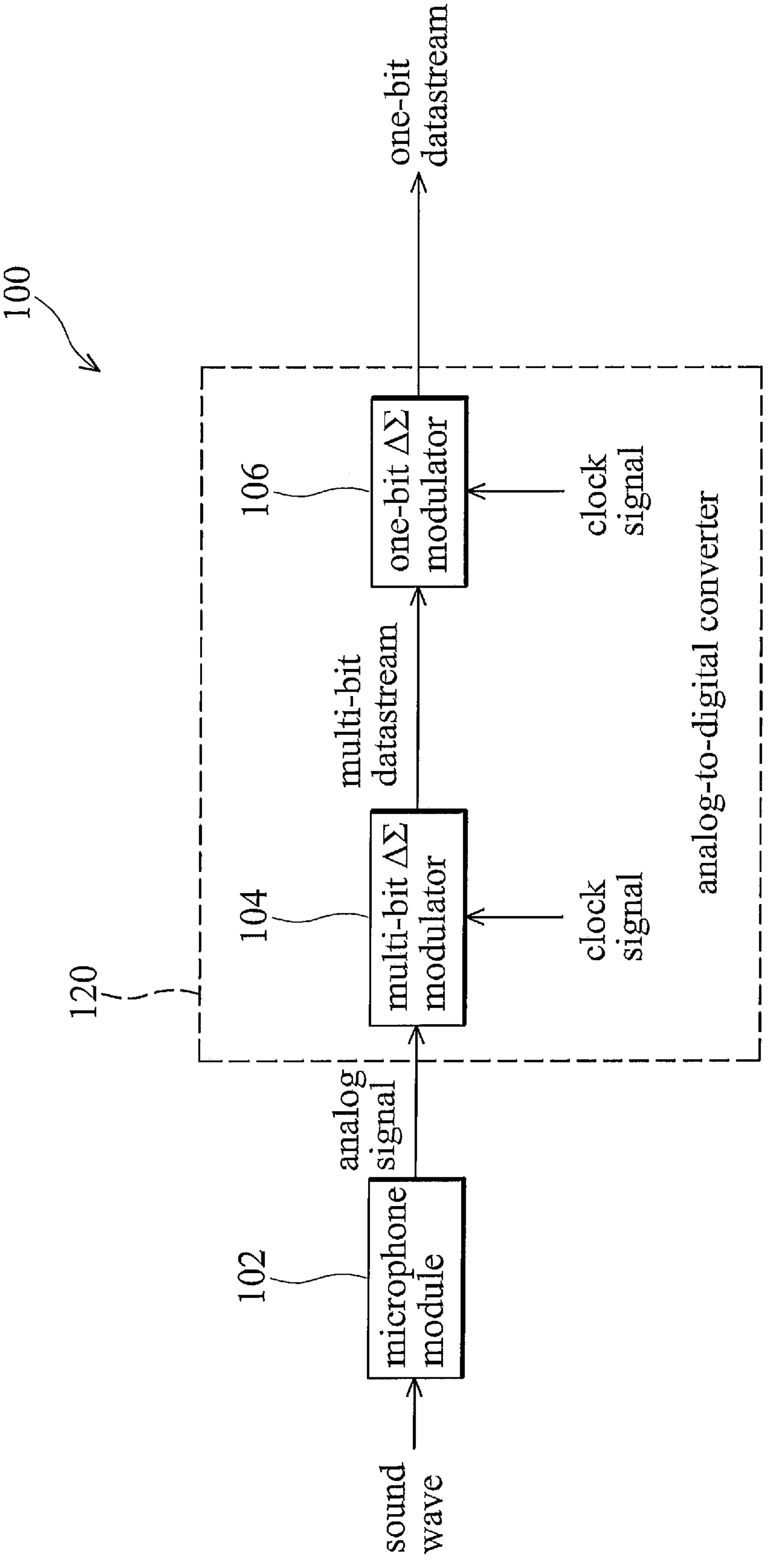
FIG. 1 (RELATED ART)
FIG. 1 shows an example of analog-to-digital converter for converting an analog signal to a digital one-bit datastram.
Figure 2:
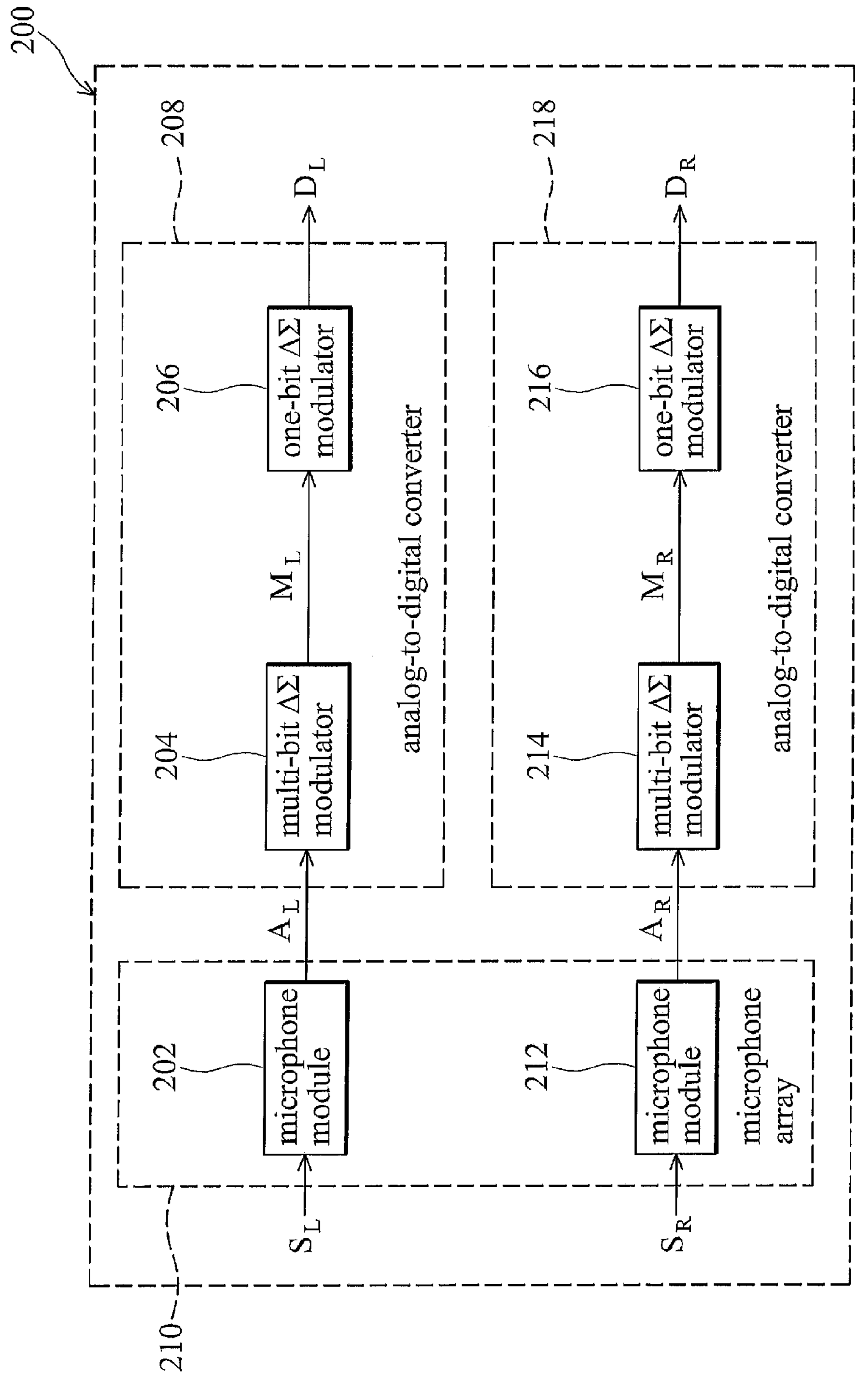
FIG. 2 (RELATED ART)
FIG. 2 is a block diagram of a portion of a signal processing device which includes a microphone array for acquiring sound waves.
Figure 3:
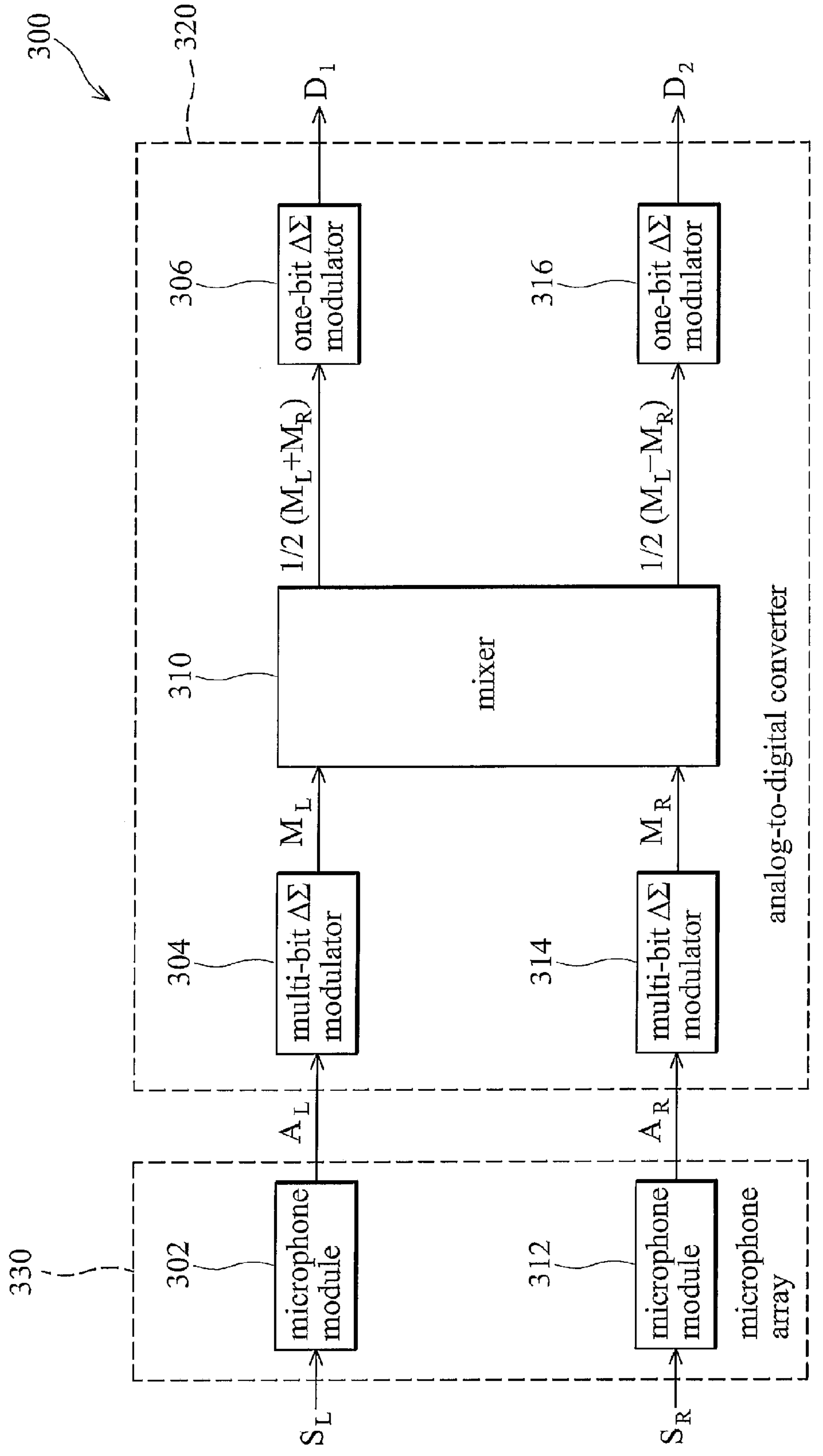
FIG. 3 is a block diagram of a portion of a signal processing device, which includes an embodiment of an analog-to-digital converter capable of mixing signals according to the invention.

FIG. 3 is a block diagram of a portion of a signal processing device 300, which includes an embodiment of an analog-to-digital converter 320 capable of mixing signals according to the invention. The signal processing device 300 also includes a microphone array 330 which acquires sound waves. There are two microphone modules 302 and 312 in the microphone array 330. Two sound waves $S_L$ and $S_R$ coming from different directions of signal processing device 300 are respectively converted by the microphone modules 302 and 312 to analog signals $A_L$ and $A_R$. The analog signals $A_L$ and $A_R$ are then delivered to the analog-to-digital converter 320 to generate digital outputs.

The digital signals $D_1$ and $D_2$ output by the analog-to digital converter 320, however, are not simply the digital correspondents of the analog signals $A_L$ and $A_R$. They are mixed digital signals of the analog signals $A_L$ and $A_R$. The analog-to-digital converter 320 includes two multi-bit delta-sigma modulators 304 and 306, two one-bit delta-sigma modulators 306 and 316, and a mixer 310. First, the analog signals $A_L$ and $A_R$ are respectively converted by the multi-bit delta-sigma modulators 304 and 306 to multi-bit datastreams $M_L$ and $M_R$. The mixer 310 then mixes the multi-bit datastreams $M_L$ and $M_R$ according to predetermined mixing functions to generate mixed multi-bit datastreams. The mixing functions may be weighted averages of the multi-bit datastreams $M_L$ and $M_R$. For example, the mixer 310 may generate a first mixed multi-bit datastreams equaling $\frac{1}{2}(M_L+M_R)$ and a second mixed multi-bit datastreams equaling $\frac{1}{2}(M_L-M_R)$. The one-bit delta-sigma modulators 306 and 316 then respectively convert the first and second mixed multi-bit datastreams to one-bit datastreams $D_1$ and $D_2$. The multi-bit delta-sigma modulators 304 and 314 and the one-bit delta-sigma modulators 306 and 316 are triggered by the same clock signal. Thus, the analog-to-digital converter 320 mixes analog signals $A_L$ and $A_R$ according to predetermined mixing functions to generate one-bit mixed datastreams $D_1$ and $D_2$.

Figure 4:
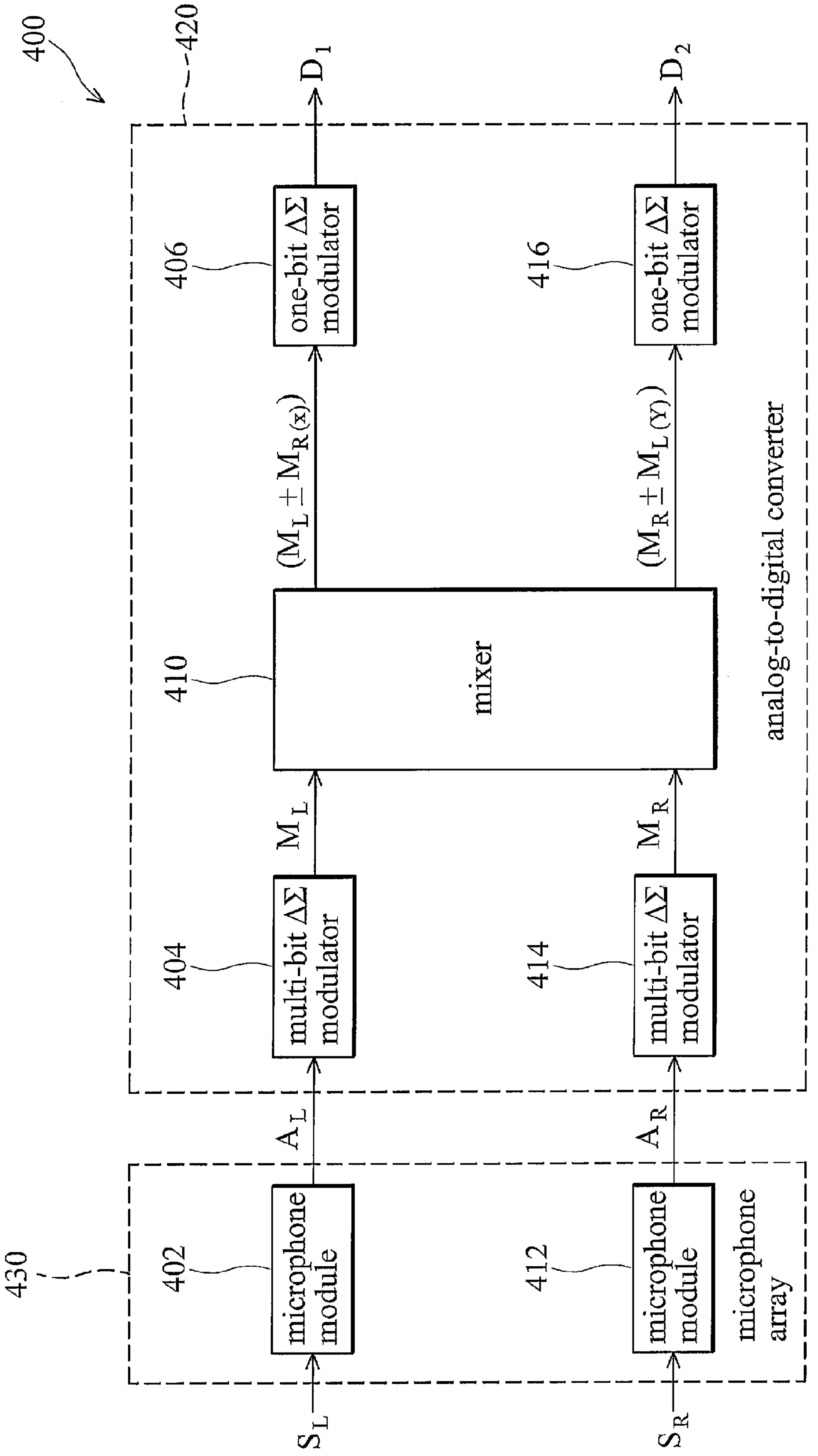
FIG. 4 is a block diagram of a portion of a signal processing device, which includes another embodiment of an analog-to-digital converter capable of mixing signals according to the invention.

FIG. 4 is a block diagram of a portion of a signal processing device 400, which includes another embodiment of an analog-to-digital converter 420 capable of mixing signals according to the invention. The signal processing device 400 is roughly similar to the signal processing device 300 of FIG. 3 except the mixer 410 of the analog-to-digital converter 420. The mixer 410 does not directly mix simultaneous samples of the multi-bit datastreams $M_L$ and $M_R$ as the mixer 310 of FIG. 3. Instead, samples of the multi-bit datastreams $M_L$ or $M_R$ are delayed for predetermined sampling periods to be mixed with the other datastream $M_R$ or $M_L$, thereby generating a mixed multi-bit datastream composed of the multi-bit datastreams $M_L$ and $M_R$ with different phase differences therebetween.

For example, the mixer 410 may generate a first mixed multi-bit datastreams equaling $(M_L \pm M_{R(x)})$ and a second mixed multi-bit datastreams equaling $(M_R \pm M_{L(Y)})$, wherein the $M_{R(x)}$ and $M_{L(Y)}$ indicate the datastreams $M_R$ and $M_L$ respectively delayed for X and Y sampling periods. The one-bit delta-sigma modulators 406 and 416 then respectively convert the first and second mixed multi-bit datastreams to one-bit datastreams $D_1$ and $D_2$. Thus, the analog-to-digital converter 420 generates digital one-bit mixed datastreams $D_1$ and $D_2$ which is combinations of the analog signals $A_L$ and $A_R$ with different phase differences therebetween.

Figure 5:
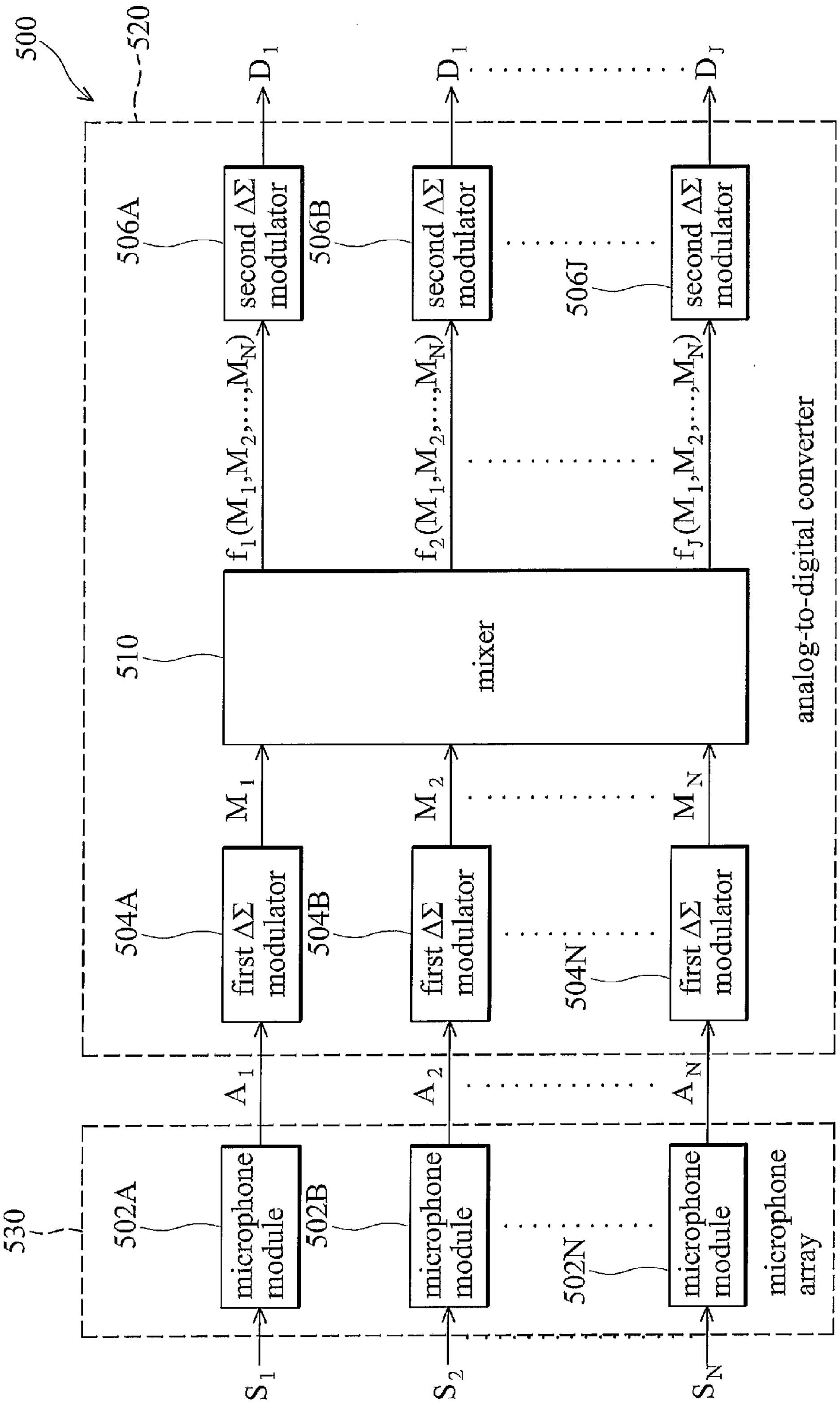
FIG. 5 is a block diagram of a portion of a signal processing devices which includes another embodiment of an analog-to-digital converter capable of mixing signals according to the invention.

FIG. 5 is a block diagram of a portion of a signal processing device 500, which includes another embodiment of an analog-to-digital converter 520 capable of mixing signals according to the invention. The signal processing device 500 also includes a microphone array 530 which acquires sound waves. There are multiple microphone modules 502A, 502B, . . . , and 502N in the microphone array 530. Sound waves $S_1$, $S_2$, . . . , and $S_N$ coming from different directions of signal processing device 500 are respectively converted by the microphone modules 502A, 502B, . . . , and 502N to analog signals $A_1$, $A_2$, . . . , and $A_N$. The analog signals $A_1$, $A_2$, . . . , and $A_N$ are then delivered to the analog-to-digital converter 520 to generate digital outputs.

The analog-to-digital converter 520 includes multiple first delta-sigma modulators 504A~504N, a mixer 510, and multiple second delta-sigma modulators 506A~506N. First, the analog signals $A_1$~$A_N$ are respectively converted by the first delta-sigma modulators 504A~504N to a plurality of first datastreams $M_1$~$M_N$. The mixer 510 then mixes first datatsreams $M_1$~$M_N$ to generate a plurality of second datastreams. The second datastreams are then converted by the second delta-sigma modulators to a plurality of third datastreams $D_1$~$D_J$. The second delta-sigma modulators 506A~506J are triggered by the same clock signal as the first delta-sigma modulators 504A~504N. In one embodiment, the first delta-sigma modulators 504A~504N are multi-bit delta-sigma modulators for generating the multi-bit datastreams $M_1$~$M_N$, and the second delta-sigma modulators 506A~506J are one-bit delta-sigma modulators for generating the one-bit datastreams $D_1$~$D_J$. In another embodiment, the first delta-sigma modulators 504A~504N are one-bit delta-sigma modulators for generating the one-bit datastreams $M_1$~$M_N$.

The second datastreams are respectively generated by the mixer 510 according to multiple mixing functions $f_1$, $f_2$, . . . , $f_J$. The mixing functions $f_1$, $f_2$, . . . , $f_J$ may be of a variety of styles, depending on the system design requirements. The mixing functions may be linear combinations of the first datastreams $M_1$~$M_N$, such as the mixer 310 of FIG. 3. The mixer 510 may amplify the first datastreams $M_1$~$M_N$ with predetermined gains, thereby generating the second datastreams composed of the amplified first datastreams. The mixer 510 may delay the first datastreams $M_1$~$M_N$ for different predetermined periods, thereby generating the second datastreams composed of the first datastreams with phase differences therebetween, such as the mixer 410 of FIG. 4. The mixer 510 may also filter the first datastreams $M_1$~$M_N$, thereby generating the second datastreams composed of the filtered first datastreams. The filtration of the first datastreams may be implemented with a low pass filter or a high pass filter. Thus, the analog-to-digital converter 520 mixes the analog signals $A_1$~$A_N$ according to predetermined mixing functions to generate the mixed digital datastreams $D_1$~$D_J$. The number J of mixed digital datastreams $D_1$~$D_J$ is not necessarily the same as the number N of the analog signals $A_1$~$A_N$, because only the demanded mixed digital datastreams $D_1$~$D_J$ are generated by the mixer 510.

Figure 6:
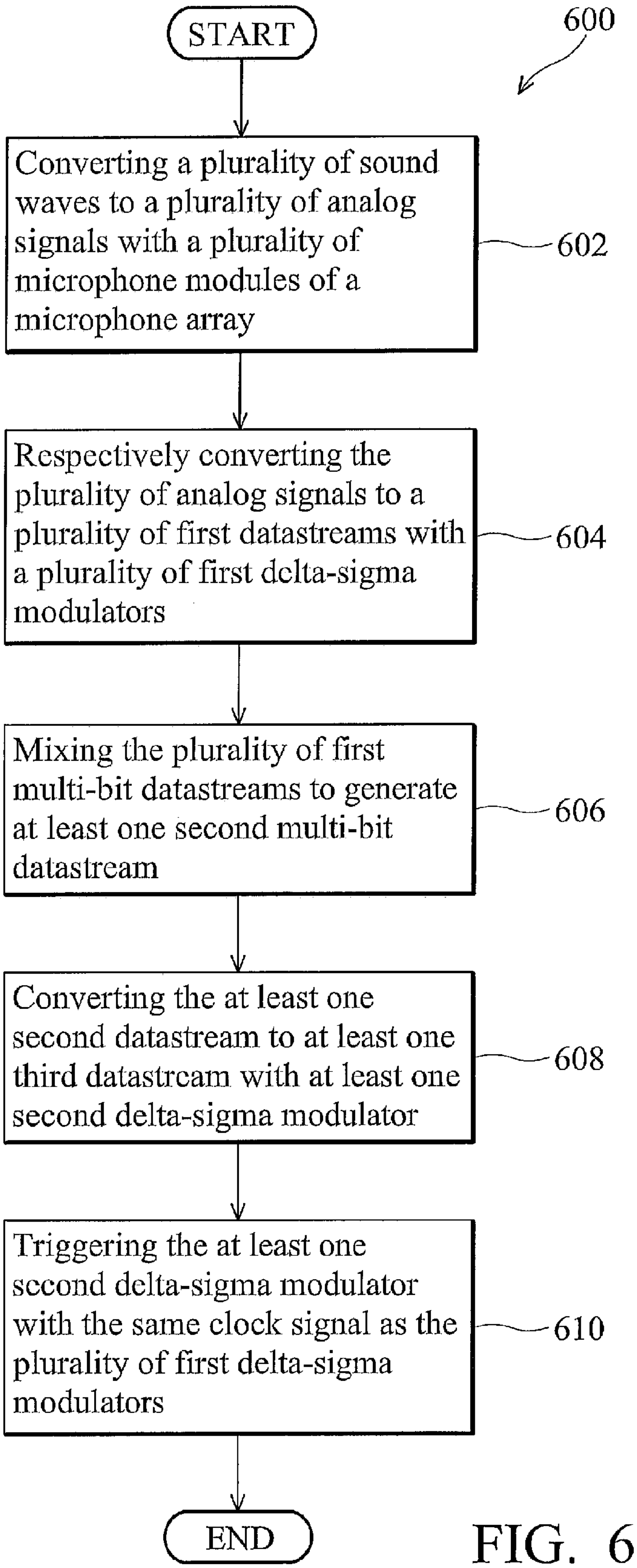
FIG. 6 shows a flowchart of a method for mixing signals with an analog-to-digital converter according to the invention.

FIG. 6 shows a flowchart of a method for mixing signals with an analog-to-digital converter according to the invention. First, a plurality of sound waves is converted to a plurality of analog signals with a plurality of microphone modules of a microphone array in step 602. The plurality of analog signals are then respectively converted to a plurality of first datastreams with a plurality of first delta-sigma modulators in step 604. The plurality of first datastreams are then mixed to generate at least one second datastream in step 606. The at least one second datastream is then converted to at least one third datastream with at least one second delta-sigma modulator in step 608. The at least one second delta-sigma modulator and the plurality of first delta-sigma modulators are triggered by the same clock signal in step 610. In one embodiment, the first delta-sigma modulators are multi-bit delta-sigma modulators, and the first and second datastreams are multi-bit datastreams. The second delta-sigma modulators are one-bit delta-sigma modulators, and the third datastream is one-bit datastreams. In another embodiment, the first delta-sigma modulators are one-bit delta-sigma modulators, and the first and second datastreams are one-bit datastreams.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for mixing signals with an analog-to-digital converter, wherein the analog-to-digital converter receives a left analog signal and a right analog signal, the method comprising:

respectively converting the left analog signal and the right analog signal to a left first datastream and a right first datastream with a plurality of first delta-sigma modulators;

mixing the left first datastream and the right first datastream according to at least one mixing function to generate at least one second datastream, wherein the at least one mixing function includes weighted averages of the left and right first datastreams; and converting the at least one second datastream to at least one third datastream with at least one second delta-sigma modulator.

2. The method as claimed in claim 1, wherein the method further comprises triggering the at least one second delta-sigma modulator and the plurality of first delta-sigma modulators by the same clock signal.

3. The method as claimed in claim 1, wherein the plurality of first delta-sigma modulators are multi-bit delta-sigma modulators, and the at least one second delta-sigma modulator is a one-bit delta-sigma modulator.

4. The method as claimed in claim 1, wherein the plurality of first delta-sigma modulators are one-bit delta-sigma modulators.

5. The method as claimed in claim 1, wherein at least one mixing function is a linear combination of the left first datastream and the right first datastream.

6. The method as claimed in claim 1, wherein the mix of the plurality of first datastreams comprises amplifying the left first datastream and the right first datastream, thereby generating the at least one second datastream composed of amplified left and right first datastreams with predetermined gains.

7. The method as claimed in claim 1, wherein the mix of the plurality of first datastreams comprises filtering the left first datastream and the right first datastream, thereby generating the at least one second datastream composed of filtered left and right first datastreams.

8. The method as claimed in claim 7, wherein the filtration of the left first datastream and the right first datastream is implemented with a low pass filter or a high pass filter.

9. The method as claimed in claim 1, wherein the mix of the left first datastream and the right first datastream comprises delaying the left first datastream and the right first datastream for different predetermined periods, thereby generating the at least one second datastream composed of the left and right first datastreams with phase differences therebetween.

10. The method as claimed in claim 1, wherein the at least one mixing function includes combinations of the left and right first datastreams with different phase differences therebetween.

11. The method as claimed in claim 1, wherein the method further comprises converting a plurality of sound waves to the left and right analog signals with a plurality of microphone modules of a microphone array.

12. An analog-to-digital converter, capable of mixing signals, wherein the analog-to-digital converter receives a left analog signals and a right analog signal, the analog-to-digital converter comprising:

a plurality of first delta-sigma modulators, respectively converting the left analog signals and the right analog signal to a left first datastream and a right first datastream;

a mixer, coupled to the plurality of first delta-sigma modulators, mixing the left first datastream and the right first datastream according to at least one mixing function to generate at least one second datastream, wherein the at least one mixing function includes weighted averages of the left and right first datastreams; and at least one second delta-sigma modulator, coupled to the mixer, converting the at least one second datastream to at least one third datastream.

13. The analog-to-digital converter as claimed in claim 12, wherein the at least one second delta-sigma modulator and the plurality of first delta-sigma modulators are triggered by the same clock signal.

14. The analog-to-digital converter as claimed in claim 12, wherein the plurality of first delta-sigma modulators are multi-bit delta-sigma modulators, and the at least one second delta-sigma modulator is a one-bit delta-sigma modulator.

15. The analog-to-digital converter as claimed in claim 12, wherein the plurality of first delta-sigma modulators are one-bit delta-sigma modulators.

16. The analog-to-digital converter as claimed in claim 12, wherein at least one mixing function is a linear combination of the left first datastreams and the right first datastream.

17. The analog-to-digital converter as claimed in claim 12, wherein the mixer amplifies the left first datastream and the right first datastream with predetermined gains, thereby generating the at least one second datastream composed of amplified left and right first datastreams.

18. The analog-to-digital converter as claimed in claim 12, wherein the mixer filters the left first datastream and the right first datastream, thereby generating the at least one second datastream composed of filtered left and right first datastreams.

19. The analog-to-digital converter as claimed in claim 18, wherein the filtration of the left first datastream and the right first datastream is implemented with a low pass filter or a high pass filter.

20. The analog-to-digital converter as claimed in claim 12, wherein the mixer delays the left first datastream and the right first datastream for different predetermined periods, thereby generating the at least one second datastream composed of the left and right first datastreams with phase differences therebetween.

21. The analog-to-digital converter as claimed in claim 12, wherein the at least one mixing function includes combinations of the left and right first datastreams with different phase differences therebetween.

22. The analog-to-digital converter as claimed in claim 12, wherein a left microphone modules and a right microphone module of a microphone array respectively convert a left sound waves and a right sound wave to the left analog signals and the right analog signal.

* * * * *